(12) United States Patent
Kamath et al.

(10) Patent No.: US 9,196,641 B2
(45) Date of Patent: Nov. 24, 2015

(54) PRINTED DOPANT LAYERS

(71) Applicant: Thin Film Electronics ASA, Oslo (NO)

(72) Inventors: Arvind Kamath, Los Altos, CA (US); James Montague Cleeves, Redwood City, CA (US); Joerg Rockenberger, San Jose, CA (US); Patrick Smith, San Jose, CA (US); Fabio Zurcher, Brisbane, CA (US)

(73) Assignee: Thin Film Electronics ASA, Oslo (NO)

( * ) Notice: Subject to any disclaimer, the term of this patent is extended or adjusted under 35 U.S.C. 154(b) by 271 days.

(21) Appl. No.: 13/633,816

(22) Filed: Oct. 2, 2012

(65) Prior Publication Data

US 2014/0094004 A1 Apr. 3, 2014

Related U.S. Application Data

(60) Division of application No. 12/797,274, filed on Jun. 9, 2010, now Pat. No. 8,304,780, which is a continuation of application No. 11/888,949, filed on Aug. 3, 2007, now Pat. No. 7,767,520.

(60) Provisional application No. 60/838,125, filed on Aug. 15, 2006.

(51) Int. Cl.
*H01L 27/00* (2006.01)
*H01L 27/12* (2006.01)
*H01L 29/66* (2006.01)

(52) U.S. Cl.
CPC ...... *H01L 27/1292* (2013.01); *H01L 29/66757* (2013.01)

(58) Field of Classification Search
CPC .............. H01L 21/288; H01L 27/1292; H01L 29/66757
USPC ........................................................ 438/157
See application file for complete search history.

(56) References Cited

U.S. PATENT DOCUMENTS 5,573,964 A 11/1996 Hsu et al.
5,770,490 A 6/1998 Frenette et al.
(Continued)

FOREIGN PATENT DOCUMENTS

CN 1655326 A 8/2005
EP 1 085 579 A1 3/2001
(Continued)

OTHER PUBLICATIONS

Korean Office Action dated Jul. 30, 2009; Korean Patent Application No. 10-2007-0081936; Korean Intellectual Property Office, Seoul Korea.
(Continued)

*Primary Examiner* — Colleen A Matthews
*Assistant Examiner* — Quovaunda V Jefferson
(74) *Attorney, Agent, or Firm* — Andrew D. Fortney; Central California IP Group, P.C.

(57) ABSTRACT

A method for making an electronic device, such as a MOS transistor, including the steps of forming a plurality of semiconductor islands on an electrically functional substrate, printing a first dielectric layer on or over a first subset of the semiconductor islands and optionally a second dielectric layer on or over a second subset of the semiconductor islands, and annealing. The first dielectric layer contains a first dopant, and the (optional) second dielectric layer contains a second dopant different from the first dopant. The dielectric layer(s), semiconductor islands and substrate are annealed sufficiently to diffuse the first dopant into the first subset of semiconductor islands and, when present, the second dopant into the second subset of semiconductor islands.

19 Claims, 3 Drawing Sheets

(56) References Cited

U.S. PATENT DOCUMENTS

| | | | |
|---|---|---|---|
| 5,817,550 | A | 10/1998 | Carey et al. |
| 5,989,945 | A | 11/1999 | Yudasaka et al. |
| 6,479,837 | B1 | 11/2002 | Ogawa et al. |
| 6,509,217 | B1 | 1/2003 | Reddy |
| 6,511,910 | B2 | 1/2003 | Asahina et al. |
| 6,514,801 | B1 | 2/2003 | Yudasaka et al. |
| 6,518,087 | B1 | 2/2003 | Furusawa et al. |
| 6,593,591 | B2 | 7/2003 | Yudasaka et al. |
| 6,723,587 | B2 | 4/2004 | Cho et al. |
| 6,767,775 | B1 | 7/2004 | Yudasaka et al. |
| 6,767,839 | B1 | 7/2004 | Hagiwara |
| 6,864,133 | B2 | 3/2005 | Aoki et al. |
| 6,884,700 | B2 | 4/2005 | Aoki et al. |
| 6,908,796 | B2 | 6/2005 | Furusawa |
| 6,943,371 | B2 | 9/2005 | Chen et al. |
| 6,994,414 | B2 | 2/2006 | Hashimoto et al. |
| 7,052,980 | B2 | 5/2006 | Aoki |
| 7,141,492 | B2 | 11/2006 | Yudasaka |
| 7,435,668 | B2 | 10/2008 | Machida et al. |
| 7,767,520 | B2 | 8/2010 | Kamath et al. |
| 2002/0074547 | A1 | 6/2002 | Yudasaka et al. |
| 2002/0105033 | A1 | 8/2002 | Zhang |
| 2002/0179906 | A1 | 12/2002 | Yudasaka et al. |
| 2003/0030689 | A1 | 2/2003 | Hashimoto et al. |
| 2003/0085057 | A1 | 5/2003 | Hashimoto |
| 2003/0134519 | A1 | 7/2003 | Yudasaka et al. |
| 2003/0234398 | A1 | 12/2003 | Aoki et al. |
| 2004/0029364 | A1 | 2/2004 | Aoki et al. |
| 2004/0248429 | A1 | 12/2004 | Aoki |
| 2005/0059193 | A1 | 3/2005 | Yoneya |
| 2005/0090092 | A1 | 4/2005 | Lee |
| 2005/0133790 | A1 | 6/2005 | Kato |
| 2005/0148121 | A1 | 7/2005 | Yamazaki et al. |
| 2005/0176183 | A1 | 8/2005 | Aoki |
| 2005/0181566 | A1 | 8/2005 | Machida et al. |
| 2005/0287825 | A1 | 12/2005 | Ogata et al. |
| 2006/0008956 | A1 | 1/2006 | Yudasaka et al. |
| 2007/0287237 | A1* | 12/2007 | Rockenberger et al. ....... 438/163 |
| 2008/0048240 | A1* | 2/2008 | Kamath et al. ................. 257/315 |
| 2008/0135890 | A1 | 6/2008 | Nakagawa et al. |

FOREIGN PATENT DOCUMENTS

| | | |
|---|---|---|
| EP | 1 113 502 A1 | 7/2001 |
| EP | 1 775 775 A1 | 4/2007 |
| GB | 2199817 A | 7/1988 |
| JP | 08-032085 | 2/1996 |
| JP | 11251259 | 9/1999 |
| JP | 2000-022161 A | 1/2000 |
| JP | 2002-324907 A | 11/2002 |
| JP | 2003-318120 A | 11/2003 |
| JP | 2003-318191 A | 11/2003 |
| JP | 2003-318193 A | 11/2003 |
| JP | 2003318119 A | 11/2003 |
| JP | 2004304022 | 10/2004 |
| JP | 2005228792 A | 8/2005 |
| JP | 2005251982 A | 9/2005 |
| JP | 2006140335 A | 6/2006 |
| KR | 2000-0062450 A | 10/2000 |
| KR | 10-2005-0081174 A | 8/2005 |
| WO | 00/59040 A1 | 10/2000 |
| WO | 00/59041 A1 | 10/2000 |
| WO | 00/59044 A1 | 10/2000 |
| WO | 2005055309 A1 | 6/2005 |
| WO | 2005/119788 A1 | 12/2005 |

OTHER PUBLICATIONS

Chinese Office Action date—stamped Jan. 16, 2009; Chinese Patent Application No. 2007101427112; The State Intellectual Property Office of P.R.C., People's Republic of China.

Kiyokazu Nakagawa, Keisuke Arimoto and Minoru Mitsui; "Field Effect Transistor and Manufacturing Method Thereof"; esp@cenet; PCT Publication No. WO2005119788 (A1); Publication Date: Dec. 15, 2005; esp@cenet Database—Worldwide; http://v3.espacenet.com/publicationDetails/biblio?DB=EPODOC &adjacent=true*locale= . . . .

Akio Machida, Takahiro Kamei and Yoshiuyuki Kawana; "Method of Doping, Method of Manufacturing Semiconductor Device, and Method of Manufacturing Electronic Appliance"; Korean Patent Abstracts; Publication No. 1020050081174 A; Publication Date: Aug. 18, 2005; Korean Intellectual Property Office, Republic of Korea.

Kazuo Yudasaka, Masahiro Furusawa and Takashi Aoki; "Device, Its Manufacturing Method and Electronic Device"; Publication No. 2003318193 A; Publication Date: Nov. 11, 2003; Patent Abstracts of Japan; Japanese Patent Office, Japan.

Takashi Aoki, Masahiro Furusawa and Kazuo Yudasaka; "Device, Its Manufacturing Method, Electrooptical Device, and Electronic Device"; Publication No. 2003-318191; Publication Date: Nov. 7, 2003; Patent Abstracts of Japan; Japanese Patent Office, Japan.

Takashi Aoki, Masahiro Furusawa and Kazuo Yudasaka; "Method for Manufacturing Method and Electronic Apparatus"; Publication No. 2003-318120; Publication Date: Nov. 7, 2003; Patent Abstracts of Japan; Japanese Patent Office, Japan.

Yasuo Matsuki, Yasuaki Yokoyama and Yaasumasa Takeuchi; "Method of Manufacturing Solar Battery"; Publication No. 2002-324907; Publication Date: Nov. 8, 2002; Patent Abstracts of Japan; Japanese Patent Office, Japan.

Hong Yong Jang; "Thin-Film Transistor and its Manufacture"; Publication No. 1020000062450 A; Publication Date: Oct. 25, 2000; Korean Patent Abstracts; Korean Intellectual Property Office, Republic of Korea.

Masahiro Furusawa, Shunichi Seki, Satoru Miyashita, Tatsuya Shimoda, Ichio Yudasaka, Yasuo Matsuki and Yasumasa Takeuchi; "Method of Manufacturing Solar Cell"; Publication No. WO0059044; Publication Date: Oct. 5, 2000; Esp@cenet database; http://v3.espacenet.com/publicationDetails/biblio?CC=WO &NR=0059044*KC=&FT=E; World Intellectual Property Organization.

Ichio Yudasaka, Tatsuya Shimoda and Shunichi Seki; "Method of Manufacturing Thin-Film Transistor"; Publication No. WO0059041A1; Publication Date: Oct. 5, 2000; World Intellectual Property Organization; Delphion Integrated View; www.delphion.com.

Ichio Yudasaka, Tatsuya Shimoda and Shunichi Seki; "Method of Manufacturing Thin-Film Transistor"; Publication No. WO005904(A1); Publication Date: Oct. 5, 2000; Esp@cenet datebase; http://v3.espacenet.com/publicationDetails/bibilo?DB=EPODOC&adjacent=true&locale=. . . ; World Intellectual Property Organization.

H. Somberg; "Ink Jet Printing for Metallization on Very Thin Solar Cells"; Global Photovoltaic Specialists, Inc.; Canoga Park, California, USA; pp. 666-667; IEEE 1990.

Kazufumi Ogawa and Kazuyasu Adachi; "Thin-Film Transistor and Manufacturing Method Thereof"; Publication No. 2000-22161(A); Publication Date: Jan. 21, 2000; Esp@cenet database; http://v3.espacenet.com/publicationDetails/biblio?DB=EPODOC &adjacent=true&locale= . . . .

Yutaka Kitsuno, Kotaro Yano, Akira Sakawaki and Keiji Kawasaki; "Manufacture of Thin Film Transistor"; Publication No. 08-032085; Publication Date: Feb. 2, 1996; Japanese Patent Abstracts; Japanese Intellectual Property Office; Japan.

Korean Office Action date Jan. 21, 2010; Korean Patent Application No. 10/2007-0081936; Korean Intellectual Property Office, Seoul, Korea.

Chinese Office Action dated Jun. 28, 2011; Chinese Patent Application No. 200710142711.2; The State Intellectual Property Office of P.R.C., People's Republic of China.

Machida Akio, Kamei Takahiro and Kawan Yoshiyuki; "Method of Doping Impurities, Methods for Producing Semiconductor Device and Applied Electronic Apparatus"; Espacenet; Chinese Publication No. CN 1655326 (A); Publication Date: Aug. 17, 2005; Espacenet Database—Worldwide; http://worldwide.espacenet.com/publicationDetails/biblio?DB=EPODOC*II=0&adjacent . . . .

(56) References Cited

OTHER PUBLICATIONS

Notification of Examination Opinions dated Jun. 28, 2011; Taiwanese Patent Application No. 96130074; Taiwan Intellectual Property Office, Taiwan.

Notice of Reasons for Rejection dated Jul. 26, 2011; Japanese Patent Application No. 2007211891; Japan Patent Office, Japan.

Masahiro Furusawa and Takashi Aoki; "Silicon Film and Method for Forming the Same, Liquid Crystal Display Device, Organic EL Display Device, Electronic Apparatus and Apparatus"; Espacenet; Japanese Publication No. JP 2003318119 (A); Publication Date: Nov. 7, 2003; Espacenet Database—Worldwide; http://worldwide.espacenet.com/.

Takashi Aoki; "Method for Forming Doped Silicon Film, and Method for Manufacturing Device"; Espacenet; Japanese Publication No. JP 2005228792 (A); Publication Date: Aug. 25, 2005; Espacenet Database—Worldwide; http://worldwide.espacenet.com/.

Takashi Aoki; "Silicon Film Forming Method, Manufacturing Method Device Using the Same, and Manufacturing Method Using Manufacturing Method of the Same Device"; Espacenet; Japanese Publication No. JP 2005251982 (A); Publication Date: Sep. 15, 2005; Espacenet Database—Worldwide; http://worldwide.espacenet.com/.

Kazuo Yudasaka; "Complementary Transistor Circuit, Electro-Optical Device, Electronic Device, and Fabrication Process of Complementary Transistor"; Espacenet; Japanese Publication No. JP 2006140335 (A); Publication Date: Jun. 1, 2006; Espacenet Database; Worldwide; http://worldwide.espacenet.com/.

Extended European Search Report; European Patent Application No. 07015916.5; Dated Jan. 12, 2012; 9 pages; European Patent Office, Germany.

Yudasaka Kazuo; "Method for Introducing Impurity to Semiconductor Layer, and Manufacturing of Thin-Film Transistor and Semiconductor Device"; Espacenet; Japanese Publication No. JP 11251259 (A); Publication Date: Sep. 17, 1999; Espacenet Database—Worldwide; http://worldwide.espacenet.com/.

Aoki Takashi; "Transistor, Method of Manufacturing the Same, and Integrated Circuit, Electrooptic Device, and Electronic Equipment Using Transistor"; Espacenet; Japanese Publication No. JP 2004304022 (A); Publication Date: Oct. 28, 2004; Espacenet Database—Worldwide; http://worldwide.espacenet.com/.

\* cited by examiner

PRINTED DOPANT LAYERS

RELATED APPLICATIONS

This application is a divisional of U.S. patent application Ser. No. 12/797,274, filed Jun. 9, 2010, which is a continuation of U.S. patent application Ser. No. 11/888,949, filed Aug. 3, 2007, now U.S. Pat. No. 7,767,520, which claims priority to U.S. Provisional Patent Application No. 60/838,125, filed Aug. 15, 2006, each of which is incorporated herein by reference in its entirety.

FIELD OF THE INVENTION

The present invention relates to MOS or thin film integrated circuits in which the source/drain (S/D) regions are fabricated by printing a doped dielectric film onto a semiconductor film and diffusing a dopant from the doped dielectric film into the semiconductor film.

DISCUSSION OF THE BACKGROUND

Typically, doped films in complementary MOS or thin film integrated circuits use two masking steps, two ion implants and associated plasma ash/wet stripping steps. It would be advantageous to replace such masking steps and associated processing steps with relatively less expensive, less time-consuming processing techniques.

SUMMARY OF THE INVENTION

The present invention is directed to methods of making thin film devices (e.g., transistors, capacitors, diodes, etc.) and circuits including the same on various substrates including, but not limited to, glass (e.g., quartz) sheets, wafers or slips, plastic and/or metal foils or slabs, Si wafers, etc., all of which may carry one or more additional (e.g., buffer, mechanical support, etc.) layers. Applications include, but are not limited to displays (e.g., flat panel, plasma, LCD, organic or inorganic LED, etc.), RF devices, sensors, photovoltaics, etc.

One object of the invention is to provide a method for making a MOS transistor, comprising the steps of forming a plurality of semiconductor islands on an electrically functional substrate; printing a first dielectric layer on or over a first subset of the semiconductor islands and (optionally) a second dielectric layer on or over a second subset of the semiconductor islands, the first dielectric layer containing a first dopant and the (optional) second dielectric layer containing a second dopant different from the first dopant; and annealing the dielectric layer(s), the semiconductor islands and the substrate sufficiently to diffuse the first dopant into the first subset of semiconductor islands and, when present, the second dopant into the second subset of semiconductor islands. In a preferred embodiment, each of the semiconductor islands comprises a Group IVA element.

Another object of the invention is to provide a method for making a MOS transistor, comprising the steps of forming a plurality of transistor gates on or over a substrate; printing a first dielectric layer on or over a first subset of the transistor gates and (optionally) a second dielectric layer on or over a second subset of the transistor gates, the first dielectric layer containing a first dopant and the optional second dielectric layer containing a second dopant different from the first dopant; forming contact holes in each of the first and (optional) second dielectric layers, exposing an upper surface of each transistor gate; and etching the first and second dielectric layers sufficiently to widen the contact holes.

Another object of the invention is to provide an electronic device, comprising a substrate; a plurality of first semiconductor islands on the substrate, the first semiconductor islands containing a first diffusible dopant; an optional plurality of second semiconductor islands on the substrate, the second semiconductor islands containing a second diffusible dopant different from the first diffusible dopant; first dielectric films on the first subset of the semiconductor islands, the first dielectric films containing the first diffusible dopant; second dielectric films on the second semiconductor islands, the second dielectric layer films containing the second diffusible dopant; and a conductive (e.g., metal) layer in electrical contact with the first and second semiconductor islands.

The invention enables an all-printed thin film transistor (TFT) with a high-temperature-compatible gate. In a preferred embodiment, this approach leverages the use of a printed silicon ink (or "printed silicon precursor") as both active and gate layers. Silicon, metal silicides and/or refractory metals allow the use of self-aligned structures that can withstand the relatively high processing temperatures typically used for dopant out-diffusion and activation. In addition, polysilicon enables (a) lower work functions for better threshold voltage (Vt) scaling, and (b) reoxidation of the gate edge to enable lower leakage currents, for memory retention. A metal gate allows for lower gate resistance. Either or both features can be used, depending on the requirements of the device.

The present invention replaces the relatively costly and time-consuming masking steps with relatively inexpensive, high-throughput printing of n- and p-type dopant source films. Optionally, the dopant dielectric film can be left in place as an interlayer dielectric, further eliminating additional dielectric removal/deposition/patterning steps.

DETAILED DESCRIPTION OF THE PREFERRED EMBODIMENTS

Figure 1:
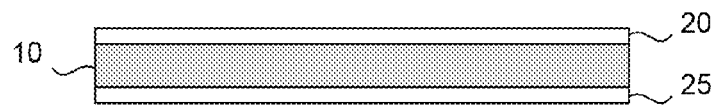
FIGS. 1-7 show cross-sectional views of an exemplary embodiment of the present CMOS devices, having a printed gate over a gate dielectric-covered silicon island, and first and second printed doped dielectrics on or over separate MOS devices, at various stages of an exemplary process flow.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

For the sake of convenience and simplicity, the terms "coupled to," "connected to," and "in communication with"

(and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition, coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "(poly)silane" refers to compounds or mixtures of compounds that consist essentially of (1) silicon and/or germanium and (2) hydrogen, and that predominantly contain species having at least 15 silicon and/or germanium atoms. Such species may contain one or more cyclic rings. The term "(cyclo)silane" refers to compounds or mixtures of compounds that consist essentially of (1) silicon and/or germanium and (2) hydrogen, and that may contain one or more cyclic rings and less than 15 silicon and/or germanium atoms. In a preferred embodiment the silane has a formula $Si_xH_y$, where x is from 3 to about 200, and y is from x to $(2x+2)$, where x may be derived from an average number molecular weight of the silane. The term "hetero(cyclo)silane" refers to compounds or mixtures of compounds that consist essentially of (1) silicon and/or germanium, (2) hydrogen, and (3) dopant atoms such as B, P, As or Sb that may be substituted by a conventional hydrocarbon, silane or germane substituent and that may contain one or more cyclic rings. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width).

The invention is particularly applicable to printed silicon, silicide or refractory metal gates in an "all-printed" process flow. Highly doped polysilicon, metal silicides (e.g. Ni-, Pt-, Pd, Co-, Ti, W, Mo-silicides and others) and/or refractory metals such as Pd, W or Mo, etc., are suitable. This further aspect also allows the use of inkjetted dopant dielectrics as dopant sources in a self-aligned flow. TFTs of the present invention capable of operating at GHz frequencies may require and/or benefit from (1) narrow channel widths, (2) source and drain terminals that are self-aligned to the gate (optionally with a small amount of overlap therebetween), and/or (3) high carrier mobility. An exemplary description of a suitable processing flow for making devices in accordance with the invention follows.

An Exemplary Process for a Partially or Fully Printed TFT

Referring to FIGS. 1-7, an exemplary process flow is shown. FIG. 1 shows a substrate 10 with lamination and/or dielectric layers 20 and 25 thereon. Substrate 10 generally comprises a conventional mechanical support structure, which may be electrically inert or active, and which may further include one or more advantageous and/or desired electrical and/or optical properties. Suitable electrically inert or inactive substrates may comprise a plate, disc, and/or sheet of a glass, ceramic, dielectric and/or plastic. Alternatively, suitable electrically conductive substrates may comprise a wafer, disc, sheet and/or foil of a semiconductor (e.g. silicon) and/or a metal. In the case where the substrate comprises a metal sheet and/or foil, the device may further comprise an inductor and/or capacitor, and the method may further comprise forming an inductor and/or capacitor from the metal substrate. However, any such electrically conductive substrate should have an insulator layer (e.g., layer 20) between it and any electrically active layer or structure thereover, except in a location where electrical contact is to be made from the structures and/or devices on the insulator to a structure formed in the metal substrate (e.g., one or more metal pads of an interposer, inductor and/or capacitor for an EAS or RFID tag; see, e.g., U.S. patent application Ser. Nos. 10/885,283, 11/104,375 and 11/243,460 respectively filed on Jul. 6, 2004, Apr. 11, 2005, and Oct. 3, 2005, the relevant portions of which are incorporated herein by reference). Preferably, the substrate comprises a member selected from the group consisting of a silicon wafer, a glass plate, a ceramic plate or disc, a plastic sheet or disc, metal foil, a metal sheet or disc, and laminated or layered combinations thereof, the electrically conductive members of which generally have a barrier layer (e.g., TiN) and/or an insulator layer (e.g., a layer of the corresponding oxide) thereon. In certain embodiments, the insulator layer may comprise a spin-on glass barrier layer having a thickness of about 1 μm. Similarly, glass and plastic substrates may further contain a planarization layer thereon to reduce the surface roughness of the substrate, a surface energy modifying layer thereon of a material that improves the adhesion and/or that controls the spreading of a subsequent material (e.g., an ink) printed or otherwise deposited thereon (see U.S. Provisional Application No. 60/919,290, filed on Mar. 20, 2007, the relevant portions of which are incorporated herein by reference), and/or a barrier layer thereon.

Figure 2:
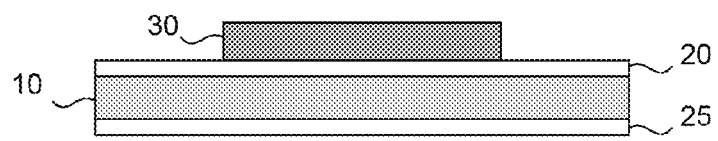

In FIG. 2, a physically isolated semiconductor island 30 is generally formed on laminate/dielectric layer 20. In one embodiment, semiconductor island 30 is formed by printing or coating a molecular and/or nanoparticle-based semiconductor ink, then converting it to a amorphous, hydrogenated Si or polysilicon thin film (e.g., by heating and/or curing; see, e.g., U.S. Pat. No. 6,878,184 and/or U.S. patent application Ser. Nos. 10/616,147, 10/789,274, 10/950,373, 10/949,013, and 10/956,714, filed on Jul. 8, 2003, Feb. 27, 2004, Sep. 24, 2004, Sep. 24, 2004, and Oct. 1, 2004, respectively, and/or U.S. Provisional Pat. Appl. Nos. 60/850,094 and 60/905,403, filed on Oct. 6, 2006 and Mar. 5, 2007, respectively). Alternatively, one may conventionally deposit a semiconductor film (e.g., by PECVD, LPCVD, sputtering of an elemental target, etc.), and pattern the film by photolithography. Further, the deposited (e.g., printed, coated or conventionally deposited) semiconductor film (e.g., in the case where the semiconductor film comprises or consists essentially of a Group IVA element) may be crystallized in part or substantially completely by (UV) laser exposure, furnace or RTA anneal, optionally in the presence of a crystallization promoter such as Au, Ni, Al, etc. When the semiconductor film is crystallized by laser annealing, one may simply remove the non-irradiated, amorphous portions of the deposited film by selective etching in accordance with known techniques.

Forming the semiconductor thin film layer 30 may include printing a semiconductor precursor ink onto laminate/dielectric layer 20 to form a pattern, drying the ink, curing the ink (generally by heating and or annealing the dried ink for a length of time sufficient to cross-link, oligomerize and/or polymerize the silane or Group IVA element precursor, and/or increase an average molecular weight, increase a viscosity and/or reduce a volatility of the composition), then partially or substantially completely crystallizing the semiconductor film pattern to form a polycrystalline (e.g., polysilicon) film. Techniques for local printing of a liquid semiconductor precursor ink directly onto a substrate (or surface film thereof) to form a semiconductor layer such as island 30 are described in copending U.S. patent application Ser. Nos. 10/949,013 and 11/203,563, filed on Sep. 24, 2004 and Aug. 11, 2005, the relevant portions of which are incorporated herein by reference. This latter approach to forming MOS TFT structures may be cost effective due to (i) the efficient usage of the semiconductor precursor materials and (ii) the combination of semiconductor deposition and patterning into one printing step.

In preferred embodiments, semiconductor inks suitable for use in the present invention comprise a liquid-phase (poly)- and/or (cyclo)silane. Typically, although not necessarily always, liquid-phase semiconductor inks further comprise a semiconductor nanoparticle (such as passivated Si, Ge or SiGe nanoparticles) and/or a solvent, preferably a cycloalkane. Such nanoparticles (or nanocrystals) may be conventionally passivated (e.g., with one or more surfactants or surface ligands, such as alkyl, aralkyl, alcohol, alkoxy, mercaptan, alkylthio, carboxylic acid and/or carboxylate groups) or unpassivated. Thus, when using an ink comprising or consisting essentially of a Group IVA element source (such as a silane- and/or nanoparticle-based precursor to Si or doped Si), forming the semiconductor layer 30 may further comprise drying the liquid-phase precursor ink after deposition. See copending U.S. application Ser. Nos. 10/616,147, 10/789,317, and 10/789,274, respectively filed Jul. 8, 2003, Feb. 27, 2004, and Feb. 27, 2004, the relevant portions of each of which are incorporated herein by reference.

Representative cyclosilane compounds of the formula $(AH_z)_k$ wherein A is Si, z is 1 or 2 (preferably 2) and k is from 3 to 12 (preferably 4 to 8) and an exemplary method for their preparation are described in greater detail in copending application Ser. No. 10/789,317, filed Feb. 27, 2004, the relevant portions of which are incorporated herein by reference. Representative hetero(cyclo)silane compounds, doped silane intermediates, exemplary methods for their preparation, and techniques for determining and/or controlling the dopant levels in the precursor inks and active films are described in greater detail in copending application Ser. Nos. 10/950,373, 10/949,013 and 10/956,714, respectively filed on Sep. 24, 2004, Sep. 24, 2004 and Oct. 1, 2004, the relevant portions of which are incorporated herein by reference. Representative oligo- and polysilane compounds are disclosed in U.S. Provisional Appl. Nos. 60/850,094 and 60/905,403, filed Oct. 6, 2006 and Mar. 5, 2007, respectively, the relevant portions of which are incorporated herein by reference.

After deposition (and generally, at least some drying), a semiconductor layer is generally cured by heating, as described above in copending U.S. patent application Ser. Nos. 10/789,274 and 10/949,013, respectively, filed on Feb. 27, 2004 and Sep. 24, 2004, the relevant portions of which are incorporated herein by reference) to form an amorphous, hydrogenated (doped) silicon (a-Si:H) layer. When a semiconductor layer originates or is formed from a (poly)silane, (cyclo)silane and/or hetero(cyclo)silane, the curing/heating step may remove unwanted precursor/ink components or byproducts such as volatile carbon-containing species or reduce the hydrogen content of the a-Si:H layer (which is particularly advantageous if laser crystallization is to be used after semiconductor film formation). When a semiconductor layer originates or is formed from a hetero(cyclo)silane, the curing/heating step may also activate part of the dopant in the hetero(cyclo)silane, but in many embodiments, dopant activation may be more likely to occur during a subsequent crystallization step (e.g., by laser irradiation and/or thermal annealing).

In various embodiments, semiconductor layer 30 comprises or consists essentially of a lightly doped inorganic semiconductor material, such as one or more Group IVA elements (e.g., silicon and/or germanium), a so-called "III-V" material (e.g., GaAs), a II-VI (or chalcogenide) semiconductor, etc., which may further contain a dopant (such as B, P, As or Sb) in a concentration of from $\sim 10^{16}$ to $\sim 5 \times 10^{18}$ atoms/$cm^3$. In a preferred embodiment, the semiconductor thin film layer 30 generally comprises or consists essentially of one or more Group IVA elements, preferably silicon or silicon-germanium.

In one embodiment, the semiconductor (transistor channel) layer 30 may be lightly doped (e.g., having a dopant concentration of from about $10^{16}$ to about $10^{18}$ atoms/$cm^3$). Exemplary lightly doped semiconductor films and methods of forming the same are disclosed in copending U.S. application Ser. Nos. 10/950,373, 10/949,013, and 10/956,714, respectively filed on Sep. 24, 2004, Sep. 24, 2004, and Oct. 1, 2004, the relevant portions of which are incorporated herein by reference. When formed from an ink containing one or more (doped) molecular- and/or nanoparticle-based silicon precursors, the lightly doped semiconductor layer 30 may have a concentration profile (e.g., dopant concentration as a function of semiconductor layer thickness) in an amorphous state that is substantially uniform throughout substantially the entire thickness of the semiconductor layer.

Typical thicknesses for semiconductor layer 30 may be from about 10, 25, 50, or 100 nm to about 200, 500 or 1000 nm, or any range of values therein. The film thickness may be chosen to optimize the electrical properties of the transistor. In addition, semiconductor layer 30 may have a width (e.g., the longest dimension shown in the cross-section of FIG. 2) of at least 1, 5, 8 or 10 μm, up to 20, 50 or 100 μm or more, or any range of values therein. The channel layer 20 may have a length (e.g., the dimension normal to the plane of the page in FIG. 2) of at least 1, 5, 10 or 20 μm, up to 50, 100, or 200 μm or more, or any range of values therein. Alternatively, when silicon island 30 comprises multiple layers, they can have the same or different doping types and/or concentrations, and they can form various types of diodes (e.g., p-n or p-i-n diodes, Schottky diodes, etc.).

Alternatively, semiconductor island 30 can be formed by conventional blanket deposition and (low-resolution) lithographic patterning. Blanket deposition may comprise, e.g., evaporation, physical vapor deposition, sputtering, or chemical vapor deposition, as is known in the art. Alternatively, blanket deposition may comprise spin-coating an ink comprising, e.g., a (poly)- and/or (cyclo)silane and/or semiconductor nanoparticles (which may be passivated) and a solvent, and curing the ink (see, e.g., U.S. Pat. No. 6,878,184 and U.S. patent application Ser. No. 10/749,876, filed Dec. 31, 2003, the relevant portions of which are incorporated herein by reference).

Figure 3:
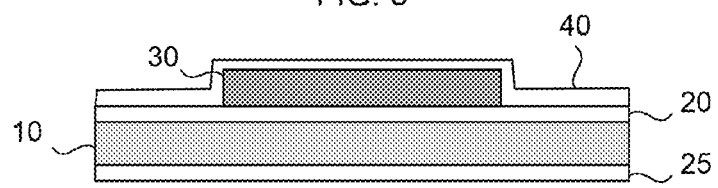

Referring to FIG. 3, gate dielectric 40 may be formed on the semiconductor (e.g., polysilicon) film 30 by plasma-enhanced, low-, atmospheric- and high-pressure chemical vapor deposition, thermal oxidation in oxidizing and/or nitriding atmospheres, chemical bath deposition of silicon and/or metal oxide(s) (e.g., silicon dioxide), liquid phase deposition (e.g., printing or coating) of a gate dielectric precursor (e.g., a $SiO_2$ precursor) and converting it to a dielectric film, atomic layer deposition and/or a combination thereof. Thus, in various embodiments, forming the gate dielectric layer 40 may comprise plasma or low-pressure chemical vapor deposition of the gate dielectric layer, thermal oxidation of a surface of the semiconductor island 30, or liquid phase or chemical bath deposition of a gate dielectric precursor. In alternative embodiments, the gate dielectric can function as a dielectric film in a capacitor.

Printing or coating a suitable dielectric precursor (e.g., liquid phase deposition of a $SiO_2$ precursor, such as a tetraalkylsiloxane or tetraalkoxysilane, or chemical bath deposition of a silicon oxide and/or metal oxide [e.g., silicon oxide] via controlled hydrolysis of silicic acid [$H_2SiF_6$] in the presence of boric acid) is generally followed by converting it to a dielectric film (e.g., by annealing). Such conversion may be preceded or followed by deposition of another metal oxide(s) (e.g. $TiO_2$, $ZrO_2$, $HfO_2$, etc.) by printing or conventional coating (e.g., spin-coating, spray-coating, slit coating, extrusion coating, meniscus coating, pen-coating, etc.), CVD, PECVD, LPCVD or sputter deposition, or by such conventional deposition of silicon oxide and/or nitride layers. Thus, in various embodiments of the present method, the gate dielectric layer 40 may comprise a plurality of layers and/or be formed on all of the plurality of semiconductor islands 30. Alternatively, however, a preferred embodiment of the present invention comprises forming a gate dielectric layer 40 on or over at least a subset of a plurality of semiconductor islands 30.

Alternatively, when the semiconductor island 30 comprises a Group IVA element (particularly silicon) and the substrate 10 is sufficiently thermally stable or tolerant, oxidation of the silicon-containing film can be accomplished by heating the film in a suitable atmosphere (air, $O_2$, ozone, $N_2O$ or steam, or combinations thereof) to a temperature higher than about 600° C. The maximum temperature may be about 1000-1100° C., more preferably about 900° C., to reduce, inhibit or prevent thermal damage (if any) to the substrate and/or films or structures thereon. However, when the substrate comprise a material that generally cannot be processed at such temperatures (e.g., aluminum and many plastics), another method of forming an oxide (e.g., printing or vapor deposition) is preferred.

The gate dielectric film 40 may have a thickness of from 20 Å to 1000 Å or any range of values therein (e.g., from 30 to 400 Å, or from 50 to 200 Å, etc.). Alternatively, a thicker gate dielectric layer 40 (e.g., in the range of from 500 to 2000 Å, and in one implementation, on the order of about 1500 Å) could be used, along with a material higher a dielectric constant than silicon dioxide or aluminum oxide. However, for high speed transistors, generally a thin gate dielectric film is preferred.

Figure 4:
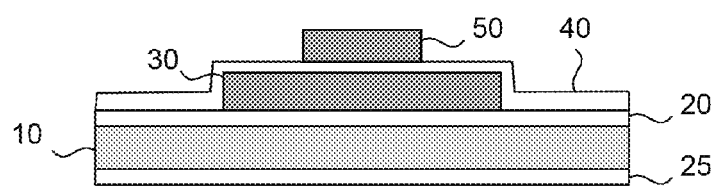

As shown in FIG. 4, the present method may further comprise forming a gate 50 on the gate dielectric layer 40 on or over some or all of the plurality of semiconductor islands 30. The gate metal may be formed by printing a suitable gate metal precursor (e.g. metal nanoparticles or organometallic compound(s), doped molecular and/or nanoparticle-based silicon ink(s), silicide precursor ink(s), etc.) then converting it to a gate metal. Use of doped silicon inks may further require and/or benefit from a high temperature anneal or laser irradiation to form polycrystalline silicon and/or to activate the dopant to achieve sufficient conductivity. Alternatively, a precursor for a seed layer may be printed on the gate dielectric layer 40, and the gate metal (e.g. Ag, Au, Cu, Pd, Pt, etc.) may be electro- or electroless plated onto the seed layer. The seed layer may require and/or benefit from an activation step before the plating process. Thus, forming the gate may comprise printing a seed layer on the gate dielectric layer 40, then electro- or electroless plating a gate material on the seed layer.

In one embodiment, the gate 50 comprises a metal silicide selected from the group consisting of nickel silicide, cobalt silicide, palladium silicide, platinum silicide, titanium silicide, tungsten silicide, and molybdenum silicide. In another embodiment, the gate 50 comprises a refractory metal selected from the group consisting of palladium, tungsten, and molybdenum. In yet another embodiment, the gate 50 comprises aluminum.

Metal inks may be deposited by coating or printing. In some embodiments, the metal may by blanket deposited by spin-coating an ink containing the metal-containing material and curing or annealing the metal, organometallic precursor(s) and/or metal nanoparticles (optionally before a laser patterning or low-resolution photolithography step).

Printing of the gate metal precursor and/or seed layer may include any of a variety of printing techniques (e.g., inkjetting, gravure printing, offset lithography, etc., any of which can also be used to form the semiconductor island 30). Furthermore, patterning the gate metal 50 may include coating or printing the gate metal precursor and locally exposing it to laser radiation such that the radiated portion changes its solubility characteristics in the exposed areas. Upon washing away the exposed or unexposed area (depending on whether the precursor is a positive or negative patternable material), the irradiated gate metal precursor stays behind to form the gate metal, optionally after an additional curing or annealing step. This embodiment may provide advantages for the patterning of high-resolution metal gates which may not directly be achievable with direct printing methods (see, e.g., copending U.S. patent application Ser. No. 11/203,563, filed on Aug. 11, 2005, the relevant portions of which are incorporated herein by reference).

A metal-containing ink may comprise or consist essentially of the metal precursor material and a solvent. For example, the metal ink may comprise a metal-containing material in an amount of from 1 to 50 wt. % (or any range of values therein) of the ink and a solvent in which the metal-containing material is soluble. The metal precursors that are generally compatible with printing or (selective) plating may comprise organometallic compounds or nanoparticles (e.g., nanocrystals) of a metal such as aluminum, titanium, vanadium, copper, silver, chromium, molybdenum, tungsten, cobalt, nickel, silver, gold, palladium, platinum, zinc, iron, etc., preferably metals capable of withstanding high-temperature processing, such as chromium, molybdenum, tungsten, nickel, palladium, platinum, conventional metal alloys thereof, such as aluminum-copper alloys, aluminum-silicon alloys, aluminum-copper-silicon alloys, aluminum-titanium alloys, etc., preferably a metal alloy that is capable of withstanding high-temperature processing, such as titanium-tungsten alloys, Mo—W alloys, etc.; and electrically conductive metal compounds, such as the nitrides and silicides of elemental metals (e.g., titanium nitride, titanium silicide, tantalum nitride, cobalt silicide, molybdenum silicide, tungsten silicide, tungsten nitride, tungsten silicon nitride, platinum silicide, etc.). For example, suitable precursors of elemental aluminum include aluminum nanoparticles and aluminum hydrides Ink precursors for the gate material may also comprise nanoparticles and/or molecular, oligomeric and/or polymeric compounds of silicon, silicide forming metals (e.g. Ni, Co, Pd, Pt, Ti, W, Mo, etc.), refractory metals (e.g., Pd, Mo, W, etc.), or combinations thereof. Such nanoparticles (or nanocrystals) may be conventionally passivated or unpassivated, as described above. The metal inks may be printed as mixtures of two or more metal precursors or of one or more metal precursors and one or more semiconductor precursors, and two or more metal inks may be successively printed and dried as laminated layers. Such mixtures and/or laminates may be further heated or otherwise reacted during or after formation of such layers to form a printed metal gate. The metal ink may further comprise one or more additives adapted to facilitate formation of low resistance contacts, such as a compound or nanoparticle of a silicide-forming metal, such as Pd, Pt, Ni, Co, Mo, W, and Ti. Thus, the gate precursor ink may comprise (i) a silicon precursor (e.g., a [poly]- and/or [cyclo]silane and/or semiconductor nanoparticle), (ii) metal nanoparticles and/or an organometallic compound, and (iii) a solvent in which the silane and the metal nanoparticles and/or the organometallic compound are soluble.

The metal-containing ink may be dried by conventional and/or otherwise known processes. For example, metal precursor inks may be dried by heating the substrate containing the printed metal precursor ink thereon at a temperature and for a length of time effective to remove the solvent and/or binder. Suitable temperatures for removing solvents from a printed ink may range from about 80° C. to about 150° C., or any range of temperatures therein (e.g., from about 100° C. to about 120° C.). Suitable lengths of time for removing solvents from a printed ink at such temperatures may ranges from about 1 second to about 10 minutes, 10 seconds to about 5 minutes, or any range of times therein (e.g., from about 30 seconds to about 5 minutes, or about 1 minute to 3 minutes, etc.). Such heating may take place on a conventional hotplate or in a conventional furnace or oven, optionally in an inert atmosphere (as described above).

The dried metal-containing material from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying gate oxide 30. When the metal-containing ink is globally (blanket) deposited or printed, annealing is generally conducted to form a metal film. In one embodiment, a resist is deposited on the annealed metal film for subsequent (laser) patterning. Also, when laser direct-writing a metal precursor ink results in a patterned metal and/or metal precursor, annealing is generally performed to form a metal layer with improved properties (e.g., conductivity, adhesion, etc.). Such annealing may comprise either annealing of already-fused metal nanoparticles, or converting a patterned metal precursor layer into a patterned metal. Suitable temperatures generally range from about 100° C. to about 300° C., or any range of temperatures therein (e.g., from about 150° C. to about 250° C.). Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, optionally in an inert or reducing atmosphere (as described above). Thus, the present method may further comprise the step of annealing the laser patterned metal gate sufficiently to improve its electrical, physical and/or adhesive properties.

Plating may comprise, in one example, (laser) printing a seed layer of metal (e.g., Pd) using nanoparticles or an organometallic compound of the metal, then selectively depositing (e.g., by electroless or electroplating) a bulk conductor (e.g., Co, Ni, Cu, Ag, Au, Pd, Pt, etc.) onto a (laser) printed metal seed layer. Metal nanoparticles or compounds comprising cobalt, nickel, platinum, or palladium (particularly palladium) are preferred for the seed layer.

In certain embodiments, laser writing or laser patterning may comprise the substeps of depositing a resist material on the blanket deposited metal-containing layer, selectively irradiating portions of the resist material with a beam of light from a laser having (i) a predetermined width and/or (ii) a predetermined wavelength or wavelength band absorbed by the resist (or by an absorptive dye in the resist), developing the selectively irradiated resist with a developer to leave a pattern corresponding to the structure being formed (in this case, gate metal 20; note that these steps apply to both positive and negative resists), removing those portions of the blanket deposited material not corresponding to the desired or predetermined pattern (typically by dry or wet etching), and removing the remaining resist material. Preferably, the light has a wavelength in the infrared (IR) band (although it could also comprise a wavelength or wavelength band in the ultraviolet (UV) and/or visible band of the spectrum), the resist (or dye) absorbs and/or is sensitive to that wavelength or band of light, and the light beam is focused on or directed at the desired or predetermined portions of the resist.

In one alternative of laser writing, a thermal resist may be advantageously used to pattern the gate metal. Irradiation of the thermal resist with a relatively narrow laser beam (e.g., 2-5 µm wide, or by passing more diffuse light through a mask configured to define structures of such width) from a laser heats the resist and changes its solubility characteristics in a conventional developer that is used to remove the irradiated (written) or non-irradiated (unwritten) portions of the resist, depending on whether the resist is positive- or negative-acting, respectively. Such resists are generally available commercially from Creo Inc., Burnaby, British Columbia, Canada. Preferred thermal resists include Graviti Thermal Resist (Creo) and the American Dye Sources Thermolak series. The resist may also comprise a conventional (photo)resist material having an infrared (IR) light-absorbing dye therein. Preferred (photo)resists include AZ1518 (AZ Electronic Materials) and SPR220 (Shipley), and preferred infrared (IR) light-absorbing dyes include American Dye Source 815EI, 830AT, 830WS and 832WS, Avecia Projet 830NP and 830 LDI, Epolin Epolight 4148, 2184, 4121, 4113, 3063 and 4149, HW Sands SDA5303 and SDA4554. After development, metal (or metal precursor) material outside of the (predetermined) gate pattern may be removed by wet or dry etching. Wet etching may also advantageously undercut the resist to provide an even narrower gate and/or transistor channel width than would be possible using dry etching.

In various embodiments, the gate comprises doped polysilicon, a metal silicide or a refractory metal. In the case of polysilicon, the silicon precursor ink may comprise a (cyclo) silane and/or silicon nanocrystals (each of which may be present in an amount of, e.g., from 1 to 50 wt. % of the ink) and a solvent in which the silane and/or silicon nanocrystals are soluble. The silicon nanocrystals may be passivated and/or functionalized to enable light-based processing (e.g., laser writing; see, e.g., U.S. patent application Ser. Nos. 10/616, 147, 10/749,876, 10/789,317, 11/084,448 and 11/203,563, filed on Jul. 8, 2003, Dec. 31, 2003, Feb. 27, 2004, Mar. 18, 2004, and Aug. 11, 2005, respectively, the relevant portions of each of which are incorporated herein by reference). Preferably, the silane ink compounds (optionally comprising Ge atoms) may optionally be doped as disclosed in U.S. patent application Ser. Nos. 10/949,013, 10/950,373, and 10/956, 714, filed on Sep. 24, 2004, Sep. 24, 2004, and Oct. 1, 2004, respectively; the relevant portions of each of which is incorporated herein by reference). After printing, the printed silane ink is cured to form (optionally doped) amorphous silicon films. Such films can be further crystallized using conventional methods (e.g., laser, furnace or metal-induced crystallization) to form (optionally doped) polycrystalline silicon. In case of undoped poly-Si gate patterns, doping may be accomplished by implantation, or more preferably, by doping from a printed doped oxide (see the description herein) to form the printed conductive gate 50. Such silicon inks and processes of making and using the same can also be applied to formation of the semiconductor islands 30 (and vice versa).

In the case of a metal silicide gate 50, the precursor ink may comprise nanoparticles and/or molecular, oligomeric and/or polymeric compounds of silicon and silicide forming metals (e.g. Ni, Co, Pd, Pt, Ti, W, Mo, etc.). The metal/Si ratio in the silicide precursor ink may range from 10/1 to 1/10. Preferably, the ink comprises silicon hydride (e.g., [poly]silane) compounds as mentioned above and nanoparticles and/or organometallic compounds of silicide forming metals (e.g., $Ni(PPH_3)_4$, $Ni(COD)_2$, $Ni(PF_3)_4$ etc.). After printing the silicide precursor ink, the printed film is cured and annealed under conditions (atmosphere, temperature and time) which facilitate the formation of the intended silicide phase.

In case of a refractory (metal) gate, the precursor ink may comprise nanoparticles and/or molecular or oligomeric compounds of refractory metals (e.g., Pd, Mo, W, etc.). Examples for molecular or oligomeric compounds include carboxylate, acetylacetonate, allyl, phosphine, carbonyl, and/or other complexes of such metals. After printing the refractory metal precursor ink, the printed film is cured and annealed under conditions (e.g., atmosphere, temperature and time) which facilitate the formation of the intended refractory metal phase.

In various embodiments, the gate 50 has a length of at least 0.1 microns, 0.5 microns, 1 micron, or 2 microns. In one implementation, the minimum gate length is about 5 microns. The gate 50 may have a width of from about 1 μm to about 1000 μm or any range of values therein (e.g., from about 2 μm to about 200 μm, or from about 5 μm to about 100 μm, etc.), and a thickness of from about 50 nm to about 10,000 nm or any range of values therein (e.g., from about 100 to about 5000 nm, or from about 200 to about 2000 nm, etc.).

In one embodiment, prior to printing the first and second dielectric layers (see FIG. 5), but after forming the gates 50 and 55, an exposed portion of the gate dielectric layer 40 is removed to form etched gate dielectric layers 42 and 44. When the exposed portions of the gate dielectric layer 40 are removed by wet etching, the etched gate dielectric films 42-44 will generally have a width and length slightly less than the corresponding dimensions of the gate metal layer (generally by about twice the thickness of the gate dielectric layer 40), but when gate dielectric film 40 is dry etched, the etched gate dielectric films 42-44 will have substantially the same width and length as the corresponding gates 50-55. Alternatively, a printed gate dielectric layer can have essentially any width and length, and when the gate dielectric has a width slightly greater than the corresponding gates 50-55 (e.g., by not more than twice the length of the corresponding gates 50-55, or perhaps about half of the distance from the sidewall of gate 50 to the corresponding sidewall of semiconductor island 30), subsequent annealing to dope the underlying semiconductor island may result in a kind of lightly doped source-drain extension ("LDD") effect.

Figure 5:
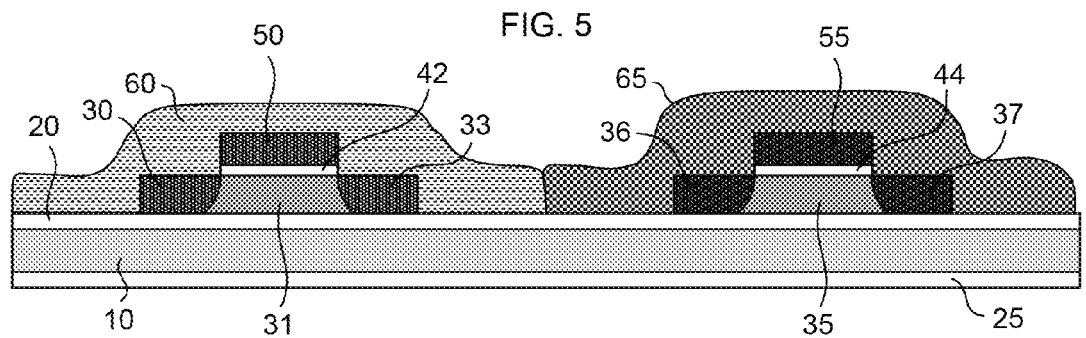

Referring to FIG. 5, in one embodiment, a first doped dielectric layer 60 and a second doped dielectric layer 65 may be printed on the respective first gate 50, second gate 55, and exposed portions of the semiconductor islands 30 and substrate surface layer 20. Generally, the dopant in the first doped dielectric layer 60 and the dopant in the second doped dielectric layer 65 are of different types (e.g., one is N-type and the other is P-type). Thus, in the present method, the first dopant (e.g., in the first dielectric layer) may comprise phosphorous, and the second dopant (e.g., in the second dielectric layer) may comprise boron. Dopant may be subsequently diffused into the underlying semiconductor islands 30 by annealing to form first channel 31, first source/drain terminals 32-33 adjacent thereto, second channel 35, and second source/drain terminals 36-37 adjacent thereto. Although not shown in FIG. 5, each of the first and second doped dielectric layers 60 and 65 may independently cover a plurality of adjacent semiconductor islands 30 (e.g., to form TFTs of the same dopant type next to each other), and/or the first and second doped dielectric layers 60-65 may overlap.

In another embodiment (not shown in the drawings), the gate dielectric layer 40 (see FIG. 4) remains on the entire surface of semiconductor island 30, and the first and second doped dielectric films 60-65 are on the gate and exposed portions of the gate dielectric layer 40. Dopant may be subsequently diffused through the gate dielectric layer 40 into the underlying semiconductor island 30 to form first channel 31, first source/drain terminals 32-33, second channel 35, and second source/drain terminals 36-37. In this embodiment, the gate dielectric layer 40 may cause a lower concentration and/or density of dopant to diffuse under the edges of the gates 50-55 (and in some cases to a shallower depth), resulting in an effect similar to lightly doped source/drain extensions (e.g., LDD's; see U.S. patent application Ser. No. 11/805,620, entitled "Graded Gate Field," and filed May 23, 2007, and U.S. Provisional Pat. Appl. No. 60/802,968, filed May 23, 2007, the relevant portions of which are incorporated by reference).

Figure 6:
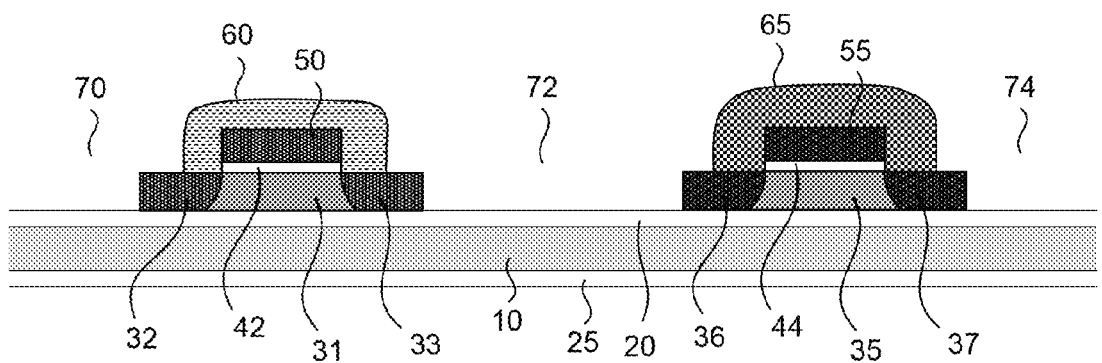

In one embodiment, and as shown in FIG. 6, after printing the first dielectric layer 60 and second dielectric layer 65, contact holes 70, 72 and 74 are formed therein, exposing (i) at least part of an upper surface of the gate 50 (which is, in turn, over the semiconductor island 30 as shown, but the contact hole to the gate 50 is, in a preferred embodiment, not over the semiconductor island 30 and is therefore not shown in the drawings) and (ii) portions of the source/drain terminals 32-33 and 36-37 adjacent to semiconductor channels 31 and 35 on opposed sides of the gates 50 and 55, respectively. Forming contact holes 70-74 may comprise removing portions of the first dielectric layer 60 and the second dielectric layer 65 (e.g., as described in U.S. patent application Ser. No. 11/818,078, filed on Jun. 12, 2007), particularly when the pattern of printing the doped dielectrics 60-65 does not include a contact hole. In the implementation shown, the entire width of the first and second doped dielectric layers 60 and 65 in at least part of the space between semiconductor islands 30 (see, e.g., FIG. 4) is removed. In another implementation (not shown), at least part of the first and second doped dielectric layers 60 and 65 remains in the space between semiconductor islands 30, at least partly to facilitate doping of the source/drain terminals 33 and 36 and/or electrical isolation of subsequently formed interconnects to adjacent source/drain terminals 33 and 36.

Alternatively, printing the first dielectric layer 60 and the second dielectric layer 65 may further comprise forming contact holes 70-74 therein, to expose an upper surface of the gates 50-55 and portions of the source/drain terminals 32-33 and 36-37 adjacent to semiconductor channels 31 and 35 on opposed sides of the gates 50-55. In other words, the pattern in which the doped dielectrics 60-65 are printed includes a contact hole in such locations. Thus, in this alternative embodiment, the doped dielectrics 60-65 are printed in a pattern covering the gates 50 and 55 over the semiconductor islands 30, but exposing at least part of the source/drain terminals 32-33 and 36-37 and gates 50-55. In the embodiment shown in FIG. 5, the doped dielectrics 60-65 are printed in a pattern covering the gates 50 and 55 and the entirety of the semiconductor islands 30. In either case, the first and second dielectric layers 60-65 may be further etched sufficiently to widen the contact holes 70-74. In a further alternative embodiment, the printed doped dielectrics 60-65 have a sufficient thickness variation in the contact areas from the remainder of the layer to enable a timed etch to open contact holes over the gates 50 and 55 and the source/drain areas 32-33 and 36-37, while only partially removing the dielectric area in the remaining areas.

Preferably, dielectrically effective thicknesses of the first and second dielectric layers 60-65 remain after etching. Thus, a preferred embodiment of the present device comprises contact holes 70-74 in at least a subset of the first and second dielectric films 60-65, exposing at least part of an upper surface of the underlying gates 50-55 and portions of each semiconductor island 30-35 on opposed sides of each gate 50 or 55, corresponding to source/drain terminals 32-33 and 36-37.

Referring to FIG. 6, after printing the doped dielectrics 60 and 65 over semiconductor islands 30 corresponding to n- and p-doped areas (and preferably before opening the contact holes 70, 72 and 74), dopant drive in and activation are conducted (generally by annealing), typically at a temperature in the range of 750-1100° C. (but preferably, in one implementation, at a temperature of ≤800° C.) using furnace annealing or Rapid Thermal Activation. In such an implementation, the gate material is selected to be able to tolerate this temperature. In a preferred embodiment, a polysilicon gate 50 can be automatically doped during drive in/activation of dopant from the dielectric layers 60-65 into the silicon islands 30, resulting in n+ poly-to-nMOS and p+ poly-to-pMOS devices. Alternatively, the dopant may be driven into the semiconductor islands 30 (e.g., silicon) by UV-lamp flash annealing or laser irradiation, using a wavelength of light and/or a light power sufficient to diffuse a dopant from the dielectric into the semiconductor and/or activate the dopant once in the semiconductor.

Thus, in various embodiments of the present device, the source and drain terminals may comprise (i) a Group IVA element, a III-V compound semiconductor such as GaAs, or a II-VI (or chalcogenide compound) semiconductor such as ZnO or ZnS, and (ii) a dopant element. Preferably, the semiconductor comprises a Group IV element (e.g., Si and/or Ge) and a dopant selected from the group consisting of B, P, As and Sb.

In a preferred embodiment, N- and P-dopants (in the form of doped dielectric layers 60-65) are printed using inkjetting. Most preferably, the N- and P-dopants are inkjetted simultaneously into different areas of the circuit from two sets of inkjet heads (1 or more inkjet heads for each type of dopant) mounted in the same printer, each set loaded with N- or P-dopant(s), respectively. Alternatively, N- and P-dopants may be printed in two alternate or separate processes and/or machines. In this latter embodiment, other printing or deposition technologies besides inkjetting, such as flexographic, offset lithographic, gravure, screen and stencil printing, slit and/or extrusion coating, etc., may be utilized. Simultaneous or sequential printing of complementary dopant materials (optionally in combination with an array type architecture for the gate layout) results in an ability to overcome resolution and drop placement accuracy issues associated with inkjet or other printing processes, allowing printing to substitute for relatively expensive masking layers, and eliminating other processing steps associated with photolithography.

The dielectric dopant can comprise a doped silane ink (as disclosed in U.S. patent application Ser. Nos. 10/949,013, 10/950,373, and 10/956,714, the relevant portions of each of which are incorporated by reference), which may be cured after printing in an oxidizing atmosphere, or a doped glass ink which is directly inkjetted onto the substrate, islands and gate (as disclosed in U.S. Provisional Appl. No. 60/926,125, filed Apr. 24, 2007, the relevant portions of which are incorporated by reference). Alternatively, the doped dielectric ink may comprise a conventional spin-on dopant (see also the list of non-volatile dopants below) and an oxidized silane (e.g., cyclo-$Si_5O_5H_{10}$, or cyclo-$[SiH(OH)]_5$).

The surface of one or more materials on which the doped dielectrics 60-65 are printed may be modified to improve wetting, optimize adhesion, flow rates, etc., and the doped dielectric ink formulation may be optimized to improve conformality over the gate. Examples of precursors for the doped glass include conventional spin-on-dopant (SOD) formulations and customized versions with increased viscosity (e.g., "customized" by replacing or diluting the solvent in the conventional formulation with a similar or compatible solvent of higher viscosity), doped molecular silicon ink formulations which can be oxidized at low temperatures (e.g. ≤400° C.) after deposition (e.g. cyclic, linear or branched silane oligomers or polymers which may include one or more dopant substituents, such as cyclo-$Si_5H_9PR_2$, wherein R is lower [$C_1$-$C_4$]alkyl, phenyl or $C_1$-$C_4$-alkyl substituted phenyl, or a dopant precursor in the formulation [e.g. tert-butyl phosphine]), oxidized doped molecular silicon ink formulations (e.g. oxidized versions of cyclic, linear or branched silane oligomers or polymers (e.g., cyclo-$Si_5O_5H_{10}$) with dopant precursors in the formulation (e.g., mono-, di- or tri-tert-butylphosphine or oxidized analogs thereof) or dopant substituents thereon, glass forming formulations (e.g., so-called sol-gel formulations) containing phosphorous or boron compounds (e.g., organophosphates such as di-n-butylphosphate, or organoborates such as tri-t-butylborate, etc.).

Alternatively, the dielectric containing the dopant(s) can be removed after drive-in/annealing (e.g., by etching). Suitable dielectrics in such an embodiment include those listed above and those that, after printing, form a thin non-volatile film (e.g., an oxide) on the surface of the semiconductor and/or gate, either intrinsically (e.g., by printing a solution containing solid precursors) or by conversion (e.g., oxidation, hydrolysis, thermal decomposition, irradiation, etc.) of a liquid-phase precursor. Possible dielectrics in such an embodiment include compounds and/or polymers containing phosphorous and oxygen (which may further include silicon, carbon, hydrogen and/or nitrogen), boron (which may further include silicon, carbon, hydrogen, oxygen and/or nitrogen), arsenic and/or antimony (either of which may further include silicon, carbon, hydrogen and/or oxygen), etc. Exemplary phosphorous-containing dielectrics include:

inorganic oxophosphorous compounds and acids (e.g., $P_2O_3$, $P_2O_5$, $POCl_3$, etc.);
phosphosilicates;
monomeric, dimeric and/or oligomeric phosphates (e.g. meta- and/or polyphosphates);
phosphonates, phosphinates, and phosphines;
organic oxophosphorous compounds and acids (e.g., alkyl (aryl) phosphates, phosphonates, phosphinates and condensation products thereof); and
alkyl- and/or arylphosphonic and/or -phosphinic acids.

Exemplary boron-containing dielectrics include:
inorganic boron compounds and acids (e.g., boric acid, $B_2O_3$);
borosilicates, borazoles and polymers thereof;
boron halogenides (e.g., $BBr_3$);
boranes (e.g., $B_{10}H_{10}$), and sila- and/or azaboranes; and
organic boron compounds and acids (e.g. alkyl/aryl boronic acid, borates, boroxines and borazoles, borane addition complexes etc.).

Exemplary arsenic and/or antimony-containing dielectrics include:

oxo- and/or aza-analogs of the above compounds, such as $As_2O_3$ and $Sb_2O_3$; and arsinosilanes, such as cyclo-$As_5(SiH_3)_5$.

Etching of the doped glass pattern and gate dielectric is accomplished by exposure to one or more suitable etchants including, but not limited to, HF-based wet etchants (e.g., buffered oxide etch [BOE], native oxide etch [NOE], aq. pyridine:HF, etc.), HF-based or -producing vapors or gases, plasma etching, etc. The etchant may be chosen such that the etch rate of the gate dielectric 40 and the doped glass layer 60 and/or 65 is sufficiently larger than the etch rate of the semiconductor layer 30 (e.g., silicon) and gate metal layer 50 to enable substantially complete removal of the doped glass (in a desired and/or predetermined amount) without substantial removal of the semiconductor layer 30 and gate metal 50.

Figure 7:
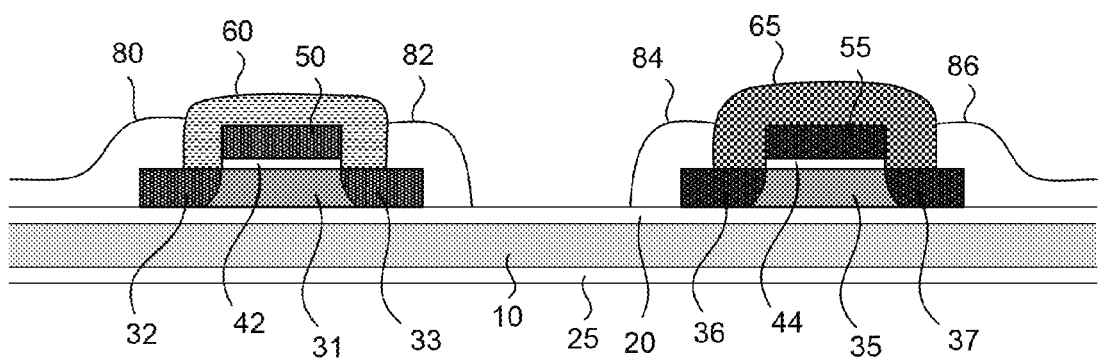

After etching, and an optional cleaning step, as shown in FIG. 7, a metal layer (e.g., comprising metal wires 80-86) is formed in contact with each of the exposed source/drain portion 32-33 and 36-37, respectively, and with an upper surface of each gate 50-55 (not shown). Preferably, metal layer 80-86 comprises printing a metal ink on the exposed surfaces of the source/drain terminals 32-33 and 36-37, the exposed surfaces of the gate(s) 50-55 (not shown), and where applicable, the first dielectric layer 60 and (optionally) second dielectric layer 65. Preferably, the metal layer is in contact with the upper surface of the exposed gate(s) and with the exposed portion(s) of the semiconductor islands. The metal layer 80-86 preferably comprises aluminum, silver, gold, copper, palladium or platinum. The metal layer 80-86 may also be formed by electro- or electroless deposition onto a printed metal/conductive seed layer.

In a preferred embodiment, as shown in FIG. 7, an interconnect metal 80-86 is printed on the exposed source/drain contacts. Furthermore, this interconnect metal may also contact the gate metal (not shown) to form a diode-connected transistor. The printed interconnect metal is used to connect transistors within the same layer and/or to provide a lower resistance ((or shallower) contact area for a via structure. The resistance of the interconnect metal is preferably lower than 10 Ohm/square. Thus, the circuit may be completed by printing an interconnect metal connecting the respective contact areas in the open via holes 70-74. The same techniques and materials described above for the gate 50 can be utilized for printing a metal interconnect (see also U.S. patent application Ser. Nos. 10/885,283, 11/104,375 and 11/243,460, respectively filed on Jul. 6, 2004, Apr. 11, 2005, and Oct. 3, 2005, the relevant portions of which are incorporated herein by reference), but the embodiment pertaining to printing a silicon layer is generally applicable to formation of a seed layer for subsequent formation of a metal silicide.

Printing and/or forming the interconnect metal may include printing a suitable interconnect metal precursor (e.g., metal nanoparticles or organometallic compound(s), silicide precursor ink(s), etc., as described above) and converting it to the interconnect metal. Alternatively, a precursor for a seed layer may be printed on the contact areas as described above, and the interconnect metal (e.g., Ag, Au, Cu, Pd, Pt, etc.) can be electro- or electrolessly plated on the seed layer. Alternatively, patterning the interconnect metal may include coating or printing the interconnect metal precursor and locally exposing it to laser radiation such that it changes its solubility characteristics in the exposed areas. Upon washing away the undesired area, the interconnect metal precursor stays behind to form the interconnect metal, generally after an additional curing or annealing step. This embodiment may provide advantages for the patterning of relatively high-resolution metal interconnect which may not directly be achievable with direct printing methods.

To ensure good contact, the structure may furthermore be annealed to form a silicide at the interface with silicon, or throughout the entire film thickness of the contact areas between the interconnect metal and the silicon. Suitable silicide forming metals include but are not limited to Al, Ni, Pd, Pt, Mo, W, Ti, Co, etc. The interconnect metal may be chosen from such silicide forming metals. Alternatively, the interconnect metal precursor ink may contain additives which form silicides. For example, silver inks doped with Ni organometallic compounds have been observed to lower the contact resistance between a silver interconnect and doped silicon source/drain contacts. An analysis has also revealed that the Ni in such an ink has segregated to the silicon interface, presumably resulting in formation of a silicide.

Conductors in communication with one of the source/drain terminals or the gate terminal may also be coupled to or continuous with another one of the conductors. For example, in a diode-configured transistor, a conductor may be in electrical communication with one source/drain terminal and the gate. In a capacitor-configured transistor, a conductor may be in electrical communication with both source/drain terminals. Alternatively, a thin dielectric layer may be formed over a source/drain terminal, and a conductor capacitively coupled to the underlying source/drain terminal may be formed thereover.

After printing the interconnect metal, if the doped dielectric is removed, an interlayer dielectric (not indicated) may be printed to cover any exposed active areas (e.g., the gate and source/drain regions), but leaving via holes in the appropriate areas. The interlayer dielectric precursor may comprise a glass-forming formulation (e.g., spin-on-glass formulations such as [organo]-silicates or -siloxanes), an organic dielectric (e.g. polyimide, BCB, etc.), an oxidized silicon precursor (e.g., an oxidized silane such as $Si_5O_5H_{10}$, etc.), or molecular and/or nanoparticle based silicon formulation (which can be oxidized after printing).

Figure 8:
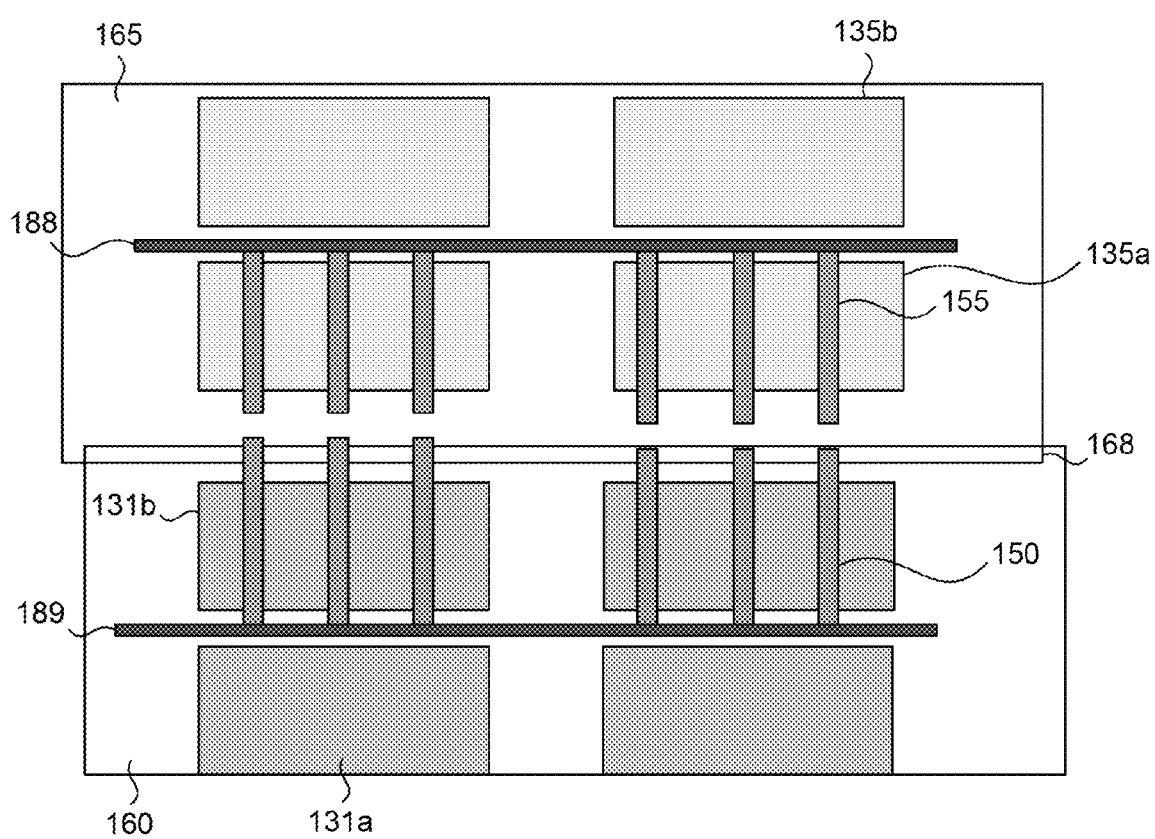
FIG. 8 shows a top-down view of an exemplary embodiment of a gate array architecture including a plurality of the present printed MOS devices.

In one aspect, the invention uses simultaneous inkjetting of two different dielectric dopants (e.g., liquid-phase spin-on dopants having a complementary dopant type therein). The invention may also advantageously employ a "gate array" style architecture as shown in FIG. 8 (and discussed below) to allow relatively relaxed design rules, and using present inkjetting capabilities (e.g., a minimum resolution, with adequate alignment margins, of about 50 μm). The technique(s) described herein are useful for manufacturing a variety of products, including RFID tags (e.g., where complementary dopant-containing dielectrics are printed) and display devices (e.g., for flat panel displays and/or plasma displays where parts of the display may be printed with only one type of doped dielectric).

As is shown by the following table, the inventive method has the following advantageous improvements: most notably, a minimum reduction of up to six processing steps, along with associated cleaning and/or pre-processing steps.

|    | Conventional Art | The Invention |
|----|------------------|---------------|
| 1. | N+ Mask          | Inkjet N+, P+ dopants |
| 2. | N+ Implant       | —             |
| 3. | Ash/Strip        | —             |
| 4. | P+ Mask          | —             |
| 5. | P+ Implant       | —             |
| 6. | Ash/Strip        | —             |

-continued

|   | Conventional Art | The Invention |
|---|---|---|
| 7. | Activate | Furnace Activate |
| 8. | ILD Deposition | — |

An exemplary process flow for making a thin film transistor in accordance with the present invention includes the following steps:
  Deposit lightly doped or undoped silane to form amorphous Si thin film islands
  (Optional) Dehydrogenate amorphous Si
  Crystallize lightly doped or undoped amorphous Si (e.g., by Excimer laser treatment or furnace treatment)
  Deposit, grow or otherwise form gate oxide
  Deposit gate metal
  (Optional) Etch exposed areas of gate oxide
  Print or otherwise pattern source and drain areas by depositing doped glass
  Activate and/or diffuse dopants into source and drain areas (e.g., by heat treatment)
  Open contact holes
  Print intermetal connect
  Conventional annealing
  Hydrogenation (optional)
  Testing (optional)

In general, one may (and typically does) leave the doped dielectric films 60-65 printed on the semiconductor layer 30 in place as an interlayer dielectric (ILD). As shown by the comparison above, the present invention can eliminate multiple tools and multiple processing steps, reduce defects and cycle time (e.g., engineer-hours and/or technician-hours used for processing), and eliminate or reduce inventory. The invention essentially condenses eight operations to two.

In one embodiment, semiconductor islands or layers are printed on the substrate, where the first dielectric layer is printed at least in part on a first subset of the semiconductor islands or layers, and the second dielectric layer is printed at least in part on a second subset of the semiconductor islands or layers. The method generally further comprises annealing the dielectric layer(s) and the semiconductor islands or layers sufficiently to diffuse the first dopant into a first subset of semiconductor islands or layers and the second dopant into a second subset of semiconductor islands or layers. The method may further comprise printing a silicon- and/or metal-containing ink in contact holes 70, and in particular, when the contact holes 70 are formed by removing portions of the first dielectric layer and the second dielectric layer. In a preferred embodiment, printing the semiconductor islands on the substrate is done prior to forming the transistor gates. In one embodiment, the first dopant comprises an N-type dopant, and preferably, the first dopant comprises phosphorous. As a result, the second dopant generally comprises boron.

The present invention takes advantage of the strengths of inkjet printing. In one embodiment, two sets of inkjet heads (1 or more heads in each set), offset by the N+-P+ space (or a multiple of the minimum spacing between semiconductor islands 30; see FIG. 8), are used for simultaneous processing, thereby minimizing alignment issues and reducing the number of tools for manufacturing operational devices. Thus, in various embodiments, the semiconductor ink may be printed in a pattern forming an array of semiconductor islands (e.g., in an x-by-y array of rows and columns, where x and y are independently an integer of at least 2, 3, 4, 8 or more), and the first and second dielectric layers may be printed on or over first and second groups (e.g., blocks, rows and/or columns) of adjacent semiconductor islands (see FIG. 8). As shown in FIG. 8, "doubling up" N-N and P-P doped dielectric stripes 160-165 allows for a relatively wide inkjet print swath. Printing doped dielectric stripes 160-165 minimizes complex shapes and wetting issues. Advantageously, the different doped dielectrics in the N+-P+ space 168 overlap with each other, although it is generally not necessary. In the case where the doped dielectrics 160-165 overlap, metal routing can be done in the N+-P+ space 168. Thus, an N+-P+ space 168 having a width of up to 15 μm will not significantly adversely affect device performance for some commercial applications.

As shown in FIG. 8, silicon islands 131a-b and 135a-b have gates (e.g., 150 and 155) thereon or thereover. One or more of the gates 150 and/or 155 may be electrically coupled to overlying signal lines 188 and/or 189. Where a contact hole (not shown) exists or is formed between a gate and a signal line (e.g., between gate 150 and signal line 189 or between gate 155 and signal line 188), the contact hole is generally not formed over the corresponding silicon island (e.g., 135a). In one embodiment, doped dielectric stripe 160 includes an N-type dopant, doped dielectric stripe 165 includes a P-type dopant, signal line 188 carries a first power supply (e.g., Vdd or Vcc), and signal line 189 carries a second power supply (e.g., ground or Vss).

One aspect of the present method comprises annealing the dielectric layer(s) and the semiconductor islands or layers sufficiently to diffuse the dopants into a subset of semiconductor islands or layers. A preferred device comprises first and second pluralities of semiconductor islands and first and second dielectric films, wherein the first dopant comprises an n-type dopant and the second dopant comprises a p-type dopant. Preferably, the first dopant comprises phosphorous, and the second dopant comprises boron.

CONCLUSION/SUMMARY

The present invention advantageously provides a low cost method for a printed approach to source/drain (S/D) layers in the fabrication of MOS or thin film integrated circuits using a doped dielectric film, having reliable, commercially acceptable electrical characteristics (e.g., on/off speeds and ratios, carrier mobilities, $V_t$'s, etc.). Printed and/or radiation-defined semiconductor structures (and, optionally, printed and/or radiation-defined conductor structures) may provide results similar to structures formed by more conventional approaches, but at a much lower cost and at a much higher throughput (on the order of hours to days, as opposed to weeks to months) than conventional process technology, and reduce the number of processing tools used for manufacturing operational devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for making a MOS transistor, comprising:
   a) forming a plurality of semiconductor islands by printing or coating a semiconductor ink on an electrically functional substrate;
   b) printing a dielectric layer containing a dopant on or over the plurality of semiconductor islands; and
   c) annealing the dielectric layer, the semiconductor islands and the substrate sufficiently to diffuse the dopant into the plurality of semiconductor islands.

2. The method of claim 1, wherein each of the semiconductor islands comprises a Group IVA element.

3. The method of claim 1, wherein forming the plurality of semiconductor islands comprises printing the semiconductor ink in a pattern, thereby forming an array of the semiconductor islands.

4. The method of claim 1, wherein the semiconductor ink comprises a silane in an amount of from 1 to 50 wt. % of the ink and a solvent in which the silane is soluble, the silane having a formula $Si_xH_y$, where x is from 3 to 1000, and y is from x to (2x+2), where x may be derived from an average number molecular weight of the silane.

5. The method of claim 1, further comprising forming gate dielectric layers on or over at least a subset of the plurality of semiconductor islands.

6. The method of claim 5, further comprising forming a gate on each of the gate dielectric layers.

7. The method of claim 6, wherein the gate(s) comprise aluminum, silver, gold, copper, palladium, tungsten, platinum, or molybdenum.

8. The method of claim 6, wherein forming the gate comprises printing a gate precursor ink on the gate dielectric layers.

9. The method of claim 8, wherein the gate precursor ink comprises metal nanoparticles and a solvent.

10. The method of claim 8, further comprising removing exposed portions of the gate dielectric layers after forming the gates and prior to printing the dielectric layer.

11. The method of claim 8, further comprising:
    a) forming contact holes in the dielectric layer, exposing (i) at least part of an upper surface of one or more of the gates and (ii) portions of one or more of the semiconductor islands on opposed sides of each of the one or more gate(s); and
    b) forming a metal layer in contact with (1) the upper surface(s) of each of the one or more gate(s) and (2) the portions of the one or more semiconductor islands, wherein forming the metal layer comprises printing a metal ink.

12. The method of claim 11, further comprising annealing the metal layer under conditions sufficient to form a metal silicide at an interface with the semiconductor island.

13. The method of claim 1, wherein printing the dielectric layer comprises inkjetting, flexographic printing, offset lithographic printing, gravure printing, or screen printing a doped dielectric ink formulation comprising a dielectric precursor, a dopant precursor, and a solvent.

14. The method of claim 13, wherein the dielectric layer is printed in a pattern on or over the plurality of semiconductor islands and the substrate.

15. The method of claim 13, wherein the dielectric precursor comprises a precursor of silicon oxide, and the dopant precursor is selected from the group consisting of oxides and oxo compounds of phosphorous, boron, arsenic and antimony.

16. The method of claim 1, wherein forming the plurality of semiconductor islands comprises curing the semiconductor ink after the semiconductor ink is printed or coated.

17. The method of claim 1, wherein the annealing is conducted at a temperature and for a length of time sufficient to form source/drain terminals in the semiconductor islands.

18. The method of claim 1, wherein forming the plurality of semiconductor islands comprises coating the semiconductor ink on the electrically functional substrate and patterning the coated semiconductor ink using low-resolution lithographic patterning.

19. The method of claim 1, wherein the semiconductor islands are physically isolated from one another.

* * * * *